United States Patent [19]
Ainsworth et al.

[11] Patent Number: 5,260,670
[45] Date of Patent: Nov. 9, 1993

[54] EQUIVALENT TIME SAMPLER USING AN OSCILLATOR

[75] Inventors: Kenneth M. Ainsworth; Daniel G. Baker, both of Aloha, Oreg.

[73] Assignee: Tektronix, Inc., Wilsonville, Oreg.

[21] Appl. No.: 821,730

[22] Filed: Jan. 16, 1992

[51] Int. Cl.⁵ .............................................. H04C 25/06
[52] U.S. Cl. .................................... 328/151; 307/353; 341/122
[58] Field of Search ........................ 328/151; 307/353; 341/122, 123, 124, 125

[56] References Cited

U.S. PATENT DOCUMENTS

| | | | |
|---|---|---|---|
| 4,393,371 | 7/1983 | Morgan-Smith | 328/151 |
| 4,414,512 | 11/1983 | Nelson | 328/151 |
| 4,634,998 | 1/1987 | Crawford | 328/151 |
| 4,641,324 | 2/1987 | Karsh et al. | 307/353 |
| 4,677,395 | 5/1987 | Baker | 331/25 |
| 4,893,316 | 1/1990 | Jane et al. | 341/122 |
| 5,012,490 | 4/1991 | Myer | 328/151 |
| 5,119,093 | 6/1992 | Vogt et al. | 341/123 |

OTHER PUBLICATIONS

Reference: Donald K. Weaver, "A Third Method of Generation and Detection of Single-Sideband Signals," Proceedings of the Institute of Radio Engineers, Dec. 1956, pp. 1703-1705.

Primary Examiner—William L. Sikes
Assistant Examiner—Scott A. Ouellette
Attorney, Agent, or Firm—Francis I. Gray

[57] ABSTRACT

An equivalent time sampler uses an oscillator for sampling an input waveform having a repetitive component. A periodic signal is derived from the input waveform, and an offset frequency is derived from the periodic signal. The periodic signal and offset frequency are input to an offset locked oscillator to generate a sampling frequency that is the combination of the periodic signal and the offset frequency. The sampling frequency is used to obtain a sample of the input waveform for each acquisition cycle of the waveform.

8 Claims, 5 Drawing Sheets

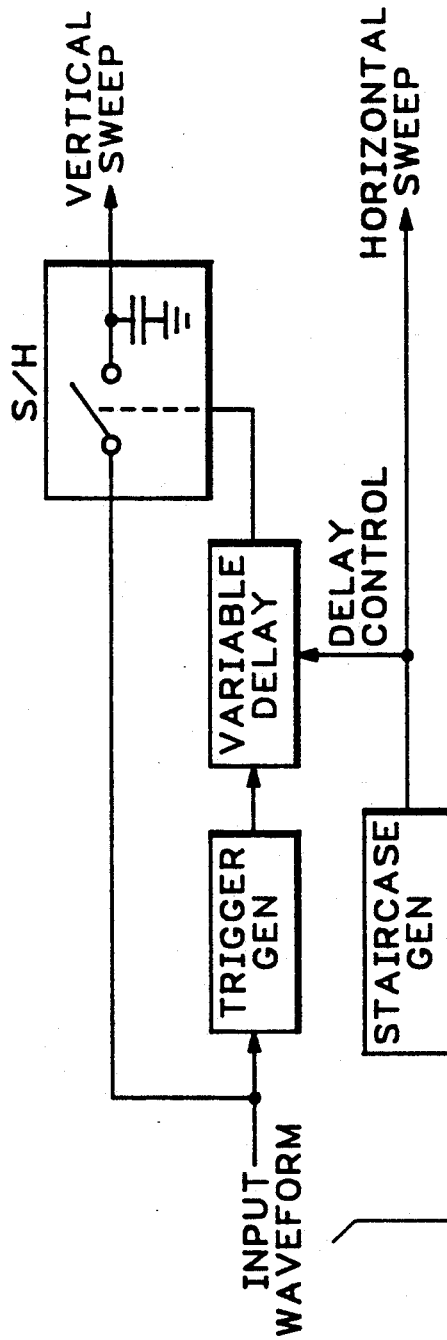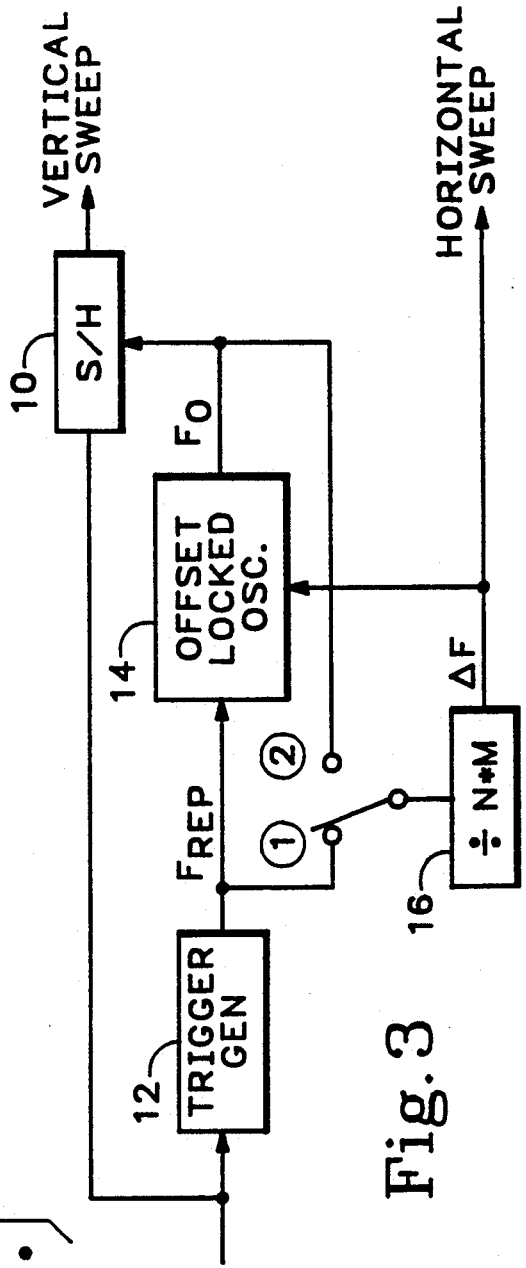
Fig. 1 (PRIOR ART)
Fig. 2
Fig. 3

EQUIVALENT TIME SAMPLER USING AN OSCILLATOR

BACKGROUND OF THE INVENTION

The present invention relates to sampling oscilloscopes, and more particularly to an equivalent time sampler for a sampling oscilloscope that uses an oscillator to develop a sample and hold trigger.

Sampling oscilloscopes are used to provide high bandwidth, voltage versus time displays of waveforms. In such a sampling oscilloscope a sample and hold circuit is triggered at several different points during the waveform. This triggering is done in an ordered fashion so that all points of the waveform are eventually sampled, as shown in FIG. 2. One common method places each successive sample point an interval deltat further from a trigger point than the last. The effect is that the sampled point, measured in degrees of the waveform period, moves monotonically and in equal increments. This is known as sequential sampling.

In a classical sequential sampler, such as shown in FIG. 1, a direct trigger is derived from the input waveform via a trigger generator. The direct trigger gates a variable delay generator to produce a delayed trigger, the amount of delay being a function of a delay control signal from a staircase generator. The delay control signal also provides a "time coordinate" for the sample. The delay trigger briefly turns on the sample and hold circuit, capturing the amplitude of the waveform. The amplitude value and time coordinate are then stored and/or displayed on a display device.

What is desired is a simplified sequential sampler that allows the observation of jitter in a waveform having a repetitive component without using an external clock.

SUMMARY OF THE INVENTION

Accordingly the present invention provides an equivalent time sampler using an oscillator to generate trigger signals for a sample and hold circuit. A waveform having a repetitive component is input to a trigger generator to produce a periodic signal that is harmonically related to the repetitive waveform. The periodic signal is applied to one input of an offset locked oscillator and to a frequency divider. The output of the frequency divider is applied to a second input of the offset locked oscillator. The offset locked oscillator produces a sampling signal having a frequency that is the difference between the two input frequencies. The sampling signal is applied to the sample and hold circuit and causes the sampled point phase to move in equal increments through the input waveform, one sample point for each acquisition cycle of the waveform. The phase locked loop of the offset locked oscillator averages the phase jitter of the periodic signal so that jitter above a predetermined frequency may be displayed.

The objects, advantages and other novel features of the present invention are apparent from the following detailed description when read in conjunction with the appended claims and attached drawing.

BRIEF DESCRIPTION OF THE DRAWING

FIG. 1 is a block diagram of a prior art sequential sampler for an oscilloscope.

FIG. 2 is a timing diagram showing the relationship between a waveform having a repetitive component input to a sequential sampler and a sampled version of the waveform.

FIG. 3 is a block diagram of a sequential sampler for an oscilloscope according to the present invention.

DESCRIPTION OF THE PREFERRED EMBODIMENT

Figure 4:
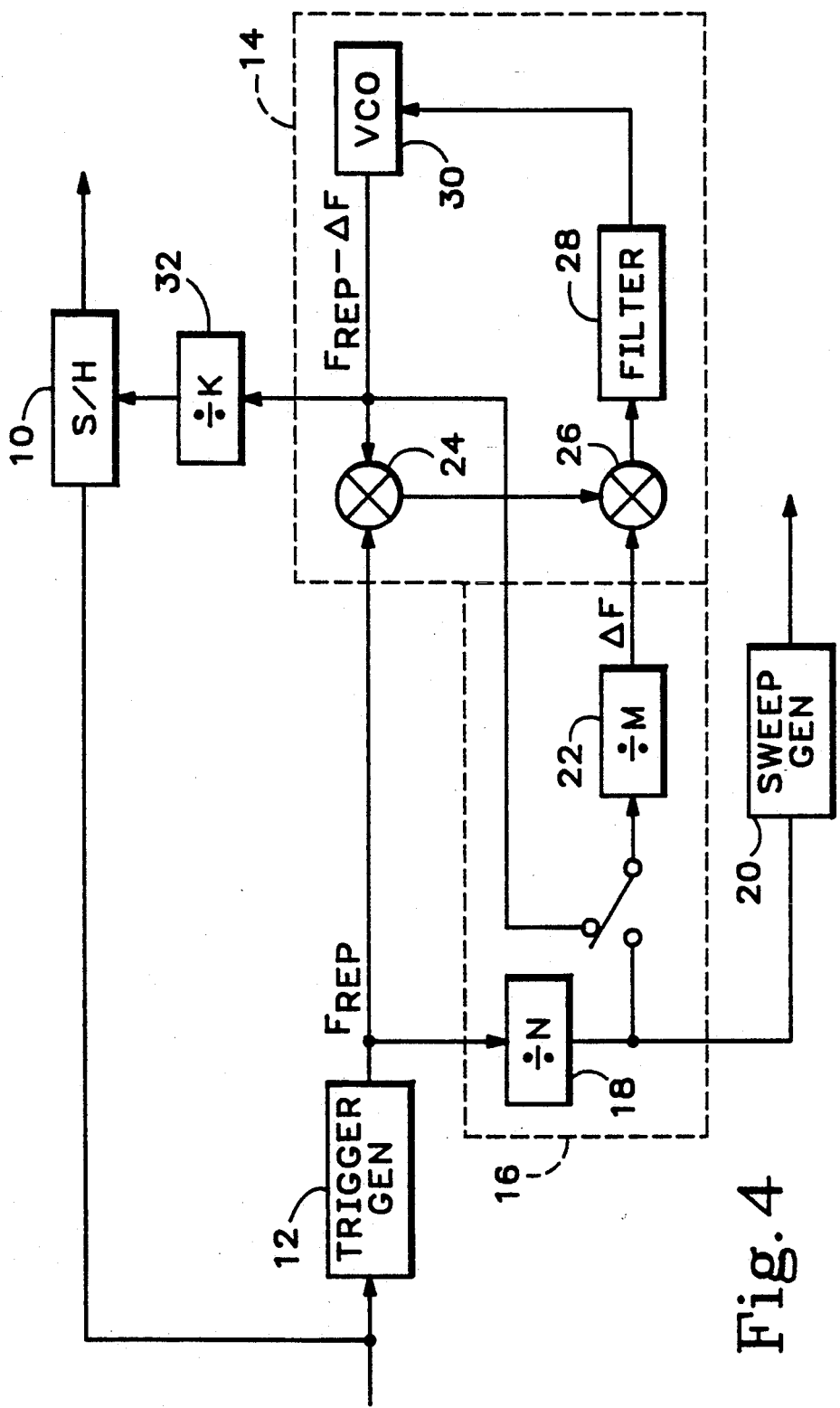
FIG. 4 is a block diagram of a first embodiment of the sequential sampler of FIG. 3 according to the present invention.

Referring now to FIG. 3 a waveform having a repetitive component, such as a digital communications signal having a given clock rate, is input to a sample and hold circuit 10 and to a conventional trigger generator 12. The output of the trigger generator 12 is a trigger signal in the form of a periodic signal having a frequency Frep corresponding to a harmonic of the frequency of the repetitive component. Where the waveform contains complex patterns, such as in a typical serial digital communications path, a data clock extractor may be used as the trigger generator, with the extracted clock signal, or a harmonic thereof, being the periodic signal. The periodic signal is input to an offset locked oscillator 14 together with an offset frequency deltaF. The offset frequency is derived either from the periodic signal or from the output of the offset locked oscillator 14, as indicated by the switch having positions 1 and 2, via a divider circuit 16. The offset locked oscillator 14 provides a control signal for the sample and hold circuit 10 having a frequency Fo that is either the difference or summation between the frequencies input to the oscillator, i.e., Of=Frep±deltaF. Where the input to the divider circuit 16 is the periodic signal Frep (position 1 of the switch), Fo=Frep*(NM±1)/NM. Where the input to the divider circuit 16 is the output of the offset locked oscillator 14 (position 2 of the switch), Fo=-Frep*NM/(NM±1). If deltaF is to be constant between the two positions, then the value of NM is adjusted accordingly. Otherwise the value of deltaF is different according to the position selected. Although a switch is shown for selecting the source of the input to the divider circuit 16, the choice of positions may be made during the design of the circuit and hardwired. The control signal causes the phase of the sampling point for each acquisition cycle to move in equal increments through the waveform to provide the sequential sampling. The nominal frequency of the offset locked oscillator 14 is approximately equal to the expected frequency of the periodic signal.

As shown in FIG. 4 the periodic signal Frep is input to a first divider 18, the output of which is input to a conventional ramp sweep generator 20 which is triggered every N cycles of the periodic signal. The output of the first divider 18 may also be input to a second divider 22, the output of which is the offset frequency deltaF=Frep/(N*M). The periodic signal is input to a mixer 24, while the offset frequency is input to a phase detector 26. The output of the mixer 24 also is input to the phase detector 26, the output of which via a loop filter 28 is a frequency control signal for a voltage controlled oscillator (VCO) 30. The output of the VCO 30 provides a second input to the mixer 24 to complete the phase locked loop, with the frequency Fo of the VCO output being the difference or summation between the frequencies of the periodic signal and the offset frequency. Alternatively the input to the second divider 22 may be the output of the VCO 30 as indicated with respect to FIG. 3, with the divisor changed accordingly if the same offset frequency is desired. Where the input waveform is a television data communications signal having a subcarrier frequency of approximately 3.58 MHz, the offset frequency may be as low as 20 Hz, i.e., $N*M$ is on the order of 179,000. The VCO output forms the control signal that is applied to the sample and hold circuit 10 to obtain a sample for each acquisition cycle of the input waveform. A third divider 32 may be inserted between the VCO 30 and the sample and hold circuit 10 to lower the sample rate. By choosing the VCO control loop bandwidth appropriately the oscillating element of the VCO 30, such as a crystal, does not respond to jitter in the input waveform above some frequency. This produces a display revealing any jitter in the waveform above this frequency. Proper choice of the frequency corner effectively implements a simple jitter mask without requiring an external clock.

Figure 5:
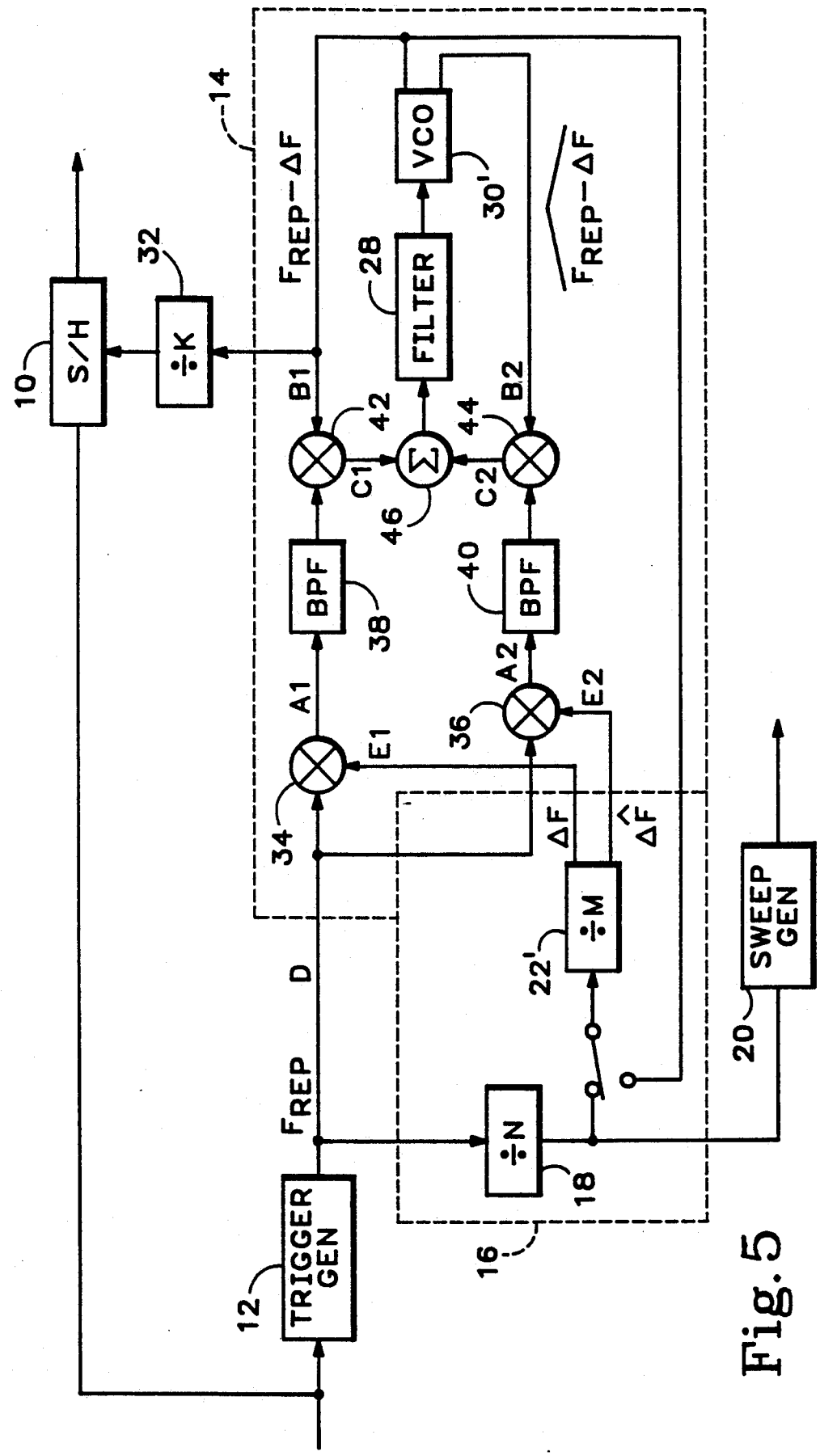
FIG. 5 is a block diagram of a second embodiment of the sequential sampler of FIG. 3 according to the present invention.
Figure 6A:
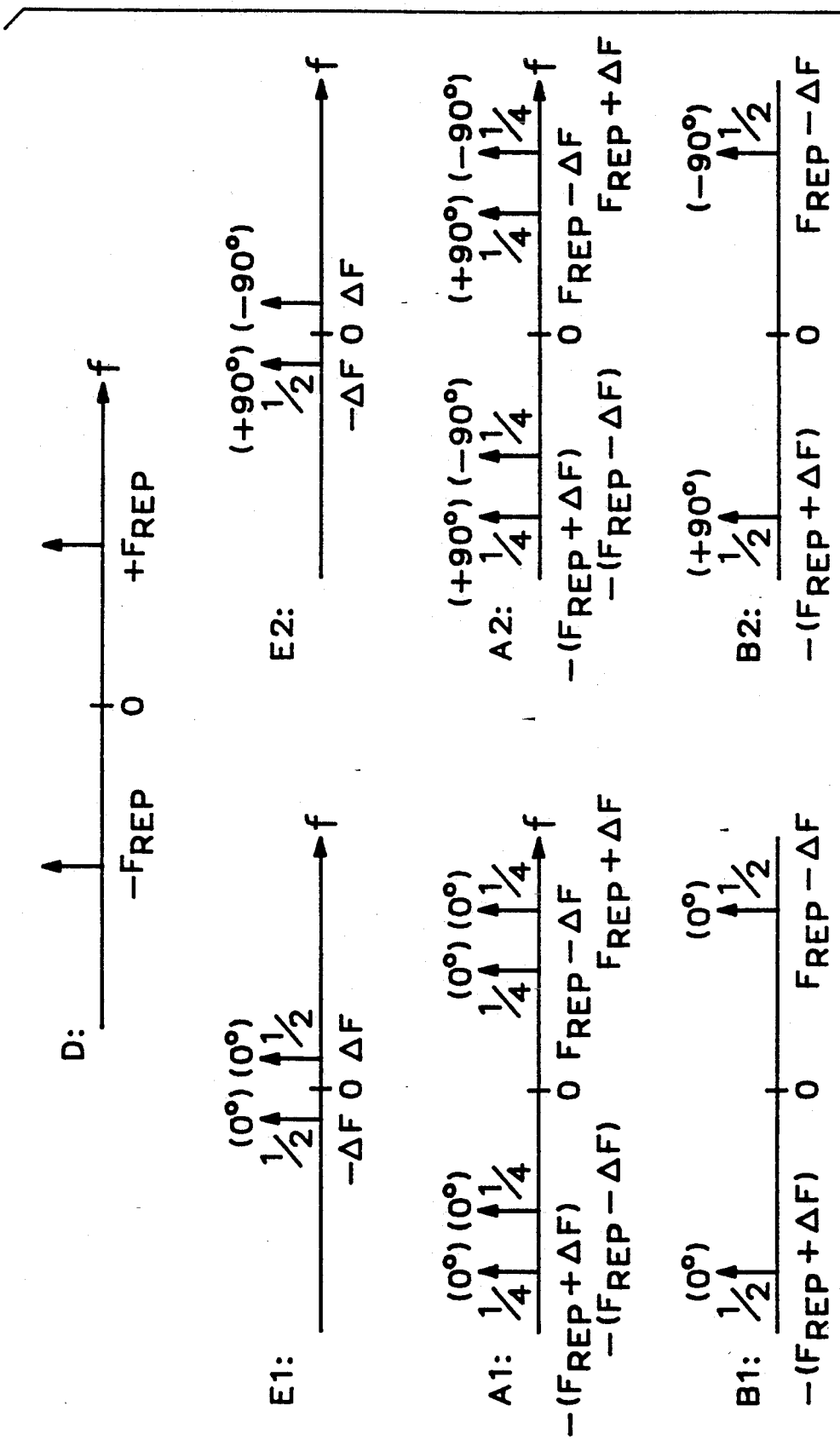
FIGS. 6A and 6B are frequency spectrum displays of the signals at various points in the embodiment of FIG. 5.
Figure 6B:
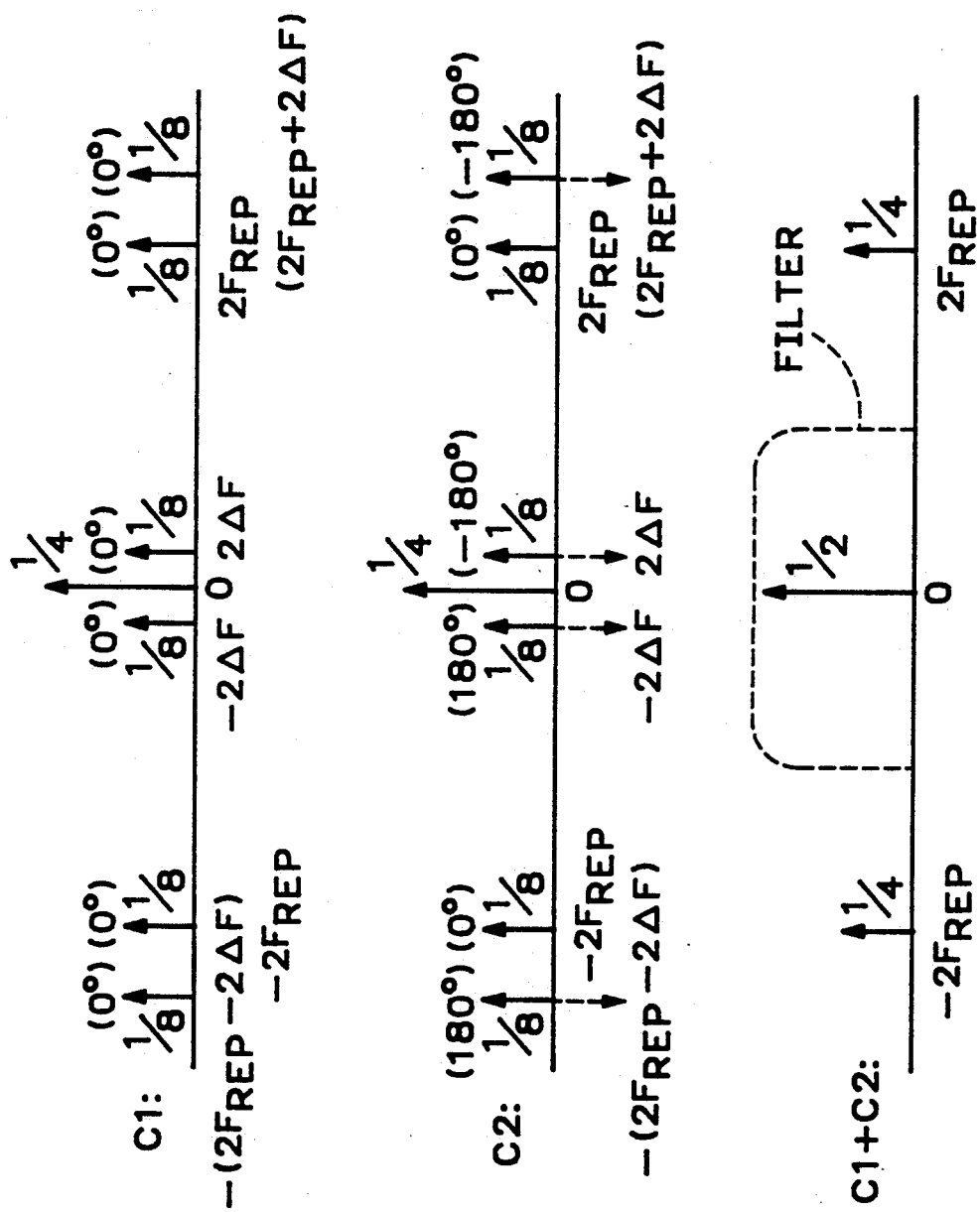

Another embodiment of the sequential sampler is shown in FIG. 5. The second divider 22' additionally provides a quadrature version delta $\wedge$ F of the offset frequency. The periodic signal is input to two mixers 34, 36, with the offset frequency input to one mixer and the quadrature offset frequency input to the other. The resulting mixed signals are input via respective bandpass filters 38, 40 to a second pair of mixers 42, 44. Likewise the VCO 30' provides both the combination frequency Fo and a quadrature combination frequency Fo. The combination and quadrature combination frequencies from the VCO 30' and the bandpass filters 38, 40 are input to the mixers 42, 44, the outputs of which are input to an adder 46. The output of the adder 46 is a DC control signal without any vestige of the offset frequency. The DC control signal is input to the loop filter 28 and thence to the VCO 30'. This particular embodiment allows for the use of a wider bandwidth filter as the loop filter since the offset frequency is canceled out by the circuit architecture, rather than being filtered out by the loop filter as in the embodiment of FIG. 4. FIG. 6 illustrates how the embodiment of FIG. 5, derived from a Weaver method modulator, cancels the offset frequency component.

Thus the present invention provides an equivalent time sampler using an oscillator for sampling an input waveform having a repetitive component that obtains a sample point from the waveform at an incrementally different point for each acquisition cycle for the waveform, the oscillator being locked to a harmonic of the repetitive component plus or minus an offset frequency derived from the input waveform.

What is claimed is:

1. An equivalent time sampler comprising:
   means for generating a periodic signal from a repetitive component of an input waveform;
   means for deriving an offset frequency related to the periodic signal;
   an oscillator providing a sampling frequency that is a combination of the periodic signal and the offset frequency; and
   means for sampling the input waveform at a sampling rate related to the sampling frequency.

2. The equivalent time sampler as recited in claim 1 wherein the sampling means comprises:
   a sample and hold circuit having the input waveform as an input and samples of the input waveform occurring at the sampling rate as an output; and
   means for dividing the sampling frequency to produce the sampling rate.

3. The equivalent time sampler as recited in claim 1 wherein the generating means comprises a data clock extractor when the input waveform is a serial digital communications signal.

4. The equivalent time sampler as recited in claim 1 wherein the deriving means comprises a divider having as an input the periodic signal and having as output the offset frequency.

5. The equivalent time sampler as recited in claim 1 wherein the deriving means comprises a divider having as an input the sampling frequency and having as output the offset frequency.

6. The equivalent time sampler as recited in claim 1 wherein the deriving means comprises:
   a first divider having an input to receive the periodic signal and having an output coupled to drive a sweep generator; and
   a second divider having an input to receive the output of the first divider and having an output to provide the offset frequency.

7. The equivalent time sampler as recited in claim 1 wherein the oscillator comprises:
   a voltage controlled oscillator having a control terminal and an output, the output of the voltage controlled oscillator being the sampling frequency;
   a mixer having one input coupled to receive the periodic signal, having another input coupled to receive the sampling frequency, and having an output;
   a phase detector having one input coupled to receive the offset frequency, having another input coupled to receive the output of the mixer, and having an output coupled to the control terminal of the voltage controlled oscillator.

8. The equivalent time sampler as recited in claim 1 wherein the oscillator comprises:
   a voltage controlled oscillator having a control terminal and an output, the output providing the sampling frequency and a quadrature sampling frequency;
   a first mixer having the periodic signal as one input and the offset frequency as another input, and having an output;
   a second mixer having the periodic signal as one input and a quadrature offset frequency from the deriving means as another input, and having an output;
   a third mixer having one input coupled to the output of the first mixer, having another input coupled to receive the sampling frequency, and having an output;
   a fourth mixer having one input coupled to the output of the second mixer, having another input coupled to receive the quadrature sampling frequency, and having an output; and
   means for combining the outputs of the third and fourth mixers to obtain a control signal for input to the control terminal of the voltage controlled oscillator.

* * * * *